United States Patent
Kanada et al.

(10) Patent No.: US 11,469,456 B2
(45) Date of Patent: Oct. 11, 2022

(54) DIAGNOSTIC APPARATUS FOR SECONDARY BATTERY AND SOC UNEVENNESS DETECTION METHOD

(71) Applicant: TOYOTA JIDOSHA KABUSHIKI KAISHA, Toyota (JP)

(72) Inventors: Ryo Kanada, Toyota (JP); Kenji Takahashi, Toyota (JP)

(73) Assignee: TOYOTA JIDOSHA KABUSHIKI KAISHA, Toyota (JP)

(*) Notice: Subject to any disclaimer, the term of this patent is extended or adjusted under 35 U.S.C. 154(b) by 212 days.

(21) Appl. No.: 17/087,758

(22) Filed: Nov. 3, 2020

(65) Prior Publication Data
US 2021/0234206 A1 Jul. 29, 2021

(30) Foreign Application Priority Data
Jan. 27, 2020 (JP) .............................. JP2020-011002

(51) Int. Cl.
*H01M 10/48* (2006.01)
*G01R 31/392* (2019.01)
*H01M 10/0525* (2010.01)
*H02J 7/00* (2006.01)
*G01R 31/3828* (2019.01)

(52) U.S. Cl.
CPC ........ *H01M 10/48* (2013.01); *G01R 31/3828* (2019.01); *G01R 31/392* (2019.01); *H01M 10/0525* (2013.01); *H02J 7/0049* (2020.01)

(58) Field of Classification Search
USPC ........................................ 324/426, 430–435
See application file for complete search history.

(56) References Cited

U.S. PATENT DOCUMENTS

2012/0121952 A1* 5/2012 Majima ................ G01R 31/392
429/90
2019/0232947 A1* 8/2019 Tashiro ................. H01M 10/42

FOREIGN PATENT DOCUMENTS

JP 2016-157565 A 9/2016

* cited by examiner

*Primary Examiner* — Vincent Q Nguyen
(74) *Attorney, Agent, or Firm* — Oliff PLC

(57) ABSTRACT

A diagnostic apparatus for a secondary battery includes a control device. The control device acquires an electricity storage amount that is the amount of electricity stored in the secondary battery, and V/K indicating the magnitude of change in OCV of the secondary battery with respect to temperature change of the secondary battery. The control device determines whether or not an SOC unevenness occurs in an electrode surface of the secondary battery by using the acquired electricity storage amount and V/K.

7 Claims, 10 Drawing Sheets

DIAGNOSTIC APPARATUS FOR SECONDARY BATTERY AND SOC UNEVENNESS DETECTION METHOD

CROSS-REFERENCE TO RELATED APPLICATION

This application claims priority to Japanese Patent Application No. 2020-011002 filed on Jan. 27, 2020, incorporated herein by reference in its entirety.

BACKGROUND

1. Technical Field

The present disclosure relates to a diagnostic apparatus for a secondary battery and an SOC unevenness detection method.

2. Description of Related Art

Japanese Unexamined Patent Application Publication No. 2016-157565 (JP 2016-157565 A) discloses a method of estimating a capacity of a secondary battery (hereinafter, referred to as a "battery capacity") by using a state of charge (SOC) of the secondary battery. In the method disclosed in JP 2016-157565 A, a total heat generated in the secondary battery during charging and discharging is separated into a polarization heat and a reaction heat, and the battery capacity is estimated based on the reaction heat. In this case, the SOC defines a start timing and an end timing of each of charging and discharging.

SUMMARY

In the method disclosed in JP 2016-157565 A, when an SOC unevenness occurs in an electrode surface of the secondary battery, the battery capacity is not necessarily estimated with high accuracy.

The present disclosure accurately determines whether or not an SOC unevenness occurs in an electrode surface of a secondary battery.

A first aspect of the present disclosure relates to a diagnostic apparatus for a secondary battery. The diagnostic apparatus includes a control device. The control device is configured to acquire an electricity storage amount that is the amount of electricity stored in the secondary battery, and V/K indicating the magnitude of change in open circuit voltage (OCV) of the secondary battery with respect to temperature change of the secondary battery. The control device is configured to determine whether or not an SOC unevenness occurs in an electrode surface of the secondary battery by using the acquired electricity storage amount and V/K.

According to the first aspect, when the SOC unevenness occurs in the electrode surface of the secondary battery, a relationship between the electricity storage amount of the secondary battery and the V/K changes. In the diagnostic apparatus for a secondary battery, it is possible to accurately determine whether or not the SOC unevenness occurs in the electrode surface of the secondary battery by using the electricity storage amount of the secondary battery and the V/K.

A state of charge (SOC) indicates a remaining electricity storage amount, and represents, for example, a proportion of a current electricity storage amount to an electricity storage amount in a full charge state as 0% to 100%. The SOC in the electrode surface corresponds to an electrode potential (or a charge amount per unit area on the electrode surface).

In the diagnostic apparatus according to the first aspect, the control device may be configured to further acquire reference information indicating a relationship between the electricity storage amount and the V/K in a case where the SOC unevenness does not occur in the electrode surface of the secondary battery. The control device may be configured to determine whether or not the SOC unevenness occurs in the electrode surface of the secondary battery by using the acquired electricity storage amount of the secondary battery, V/K, and reference information.

In the diagnostic apparatus according to the first aspect, the control device may be configured to, in a case where an inflection point that does not appear when the SOC unevenness does not occur in the electrode surface of the secondary battery exists in a graph of the acquired electricity storage amount of the secondary battery and V/K, determine that the SOC unevenness occurs in the electrode surface of the secondary battery. The control device may determine the presence or absence of the inflection point by using a plurality of combinations of the electricity storage amount of the secondary battery and the V/K measured most recently. Further, the control device may determine the presence or absence of the inflection point by using the reference information.

In the diagnostic apparatus according to the first aspect, the control device may be configured to, in a case where determination is made that the SOC unevenness does not occur in the electrode surface of the secondary battery, estimate a degree of deterioration of the secondary battery by using an SOC of the secondary battery.

According to the first aspect, in a case where determination is made that the SOC unevenness does not occur in the electrode surface of the secondary battery, the degree of deterioration of the secondary battery is estimated. With this, it is possible to estimate a deterioration state of the secondary battery with high accuracy.

In the diagnostic apparatus according to the first aspect, the control device may be configured to, in a case where determination is made that the SOC unevenness occurs in the electrode surface of the secondary battery, execute processing of reducing the SOC unevenness.

According to the first aspect, when the SOC unevenness occurs in the electrode surface of the secondary battery, it is possible to execute the processing of reducing the SOC unevenness. With this, it is possible to suppress the SOC unevenness.

A second aspect of the present disclosure relates to an SOC unevenness detection method. The SOC unevenness detection method includes acquiring an electricity storage amount that is the amount of electricity stored in a secondary battery, and V/K indicating the magnitude of change in OCV of the secondary battery with respect to temperature change of the secondary battery. The SOC unevenness detection method includes determining whether or not an SOC unevenness occurs in an electrode surface of the secondary battery by using the electricity storage amount and the V/K.

In the SOC unevenness detection method, it is possible to accurately determine whether or not the SOC unevenness occurs in the electrode surface of the secondary battery by using the electricity storage amount of the secondary battery and the V/K.

In the SOC unevenness detection method according to the second aspect, the secondary battery may be a lithium-ion secondary battery. With the SOC unevenness detection method, it is possible to determine, with high accuracy, whether or not the SOC unevenness occurs in the electrode surface of the lithium-ion secondary battery.

The secondary battery to be diagnosed may be a single battery, a module including a plurality of single batteries, or an assembled battery including a plurality of single batteries (cells) electrically connected to one another.

The secondary battery may be a battery mounted on an electrified vehicle or a battery recovered from the electrified vehicle. The electrified vehicle is a vehicle configured to travel using electric power stored in a battery. The electrified vehicle includes a fuel cell vehicle (FC vehicle), a range extender EV, and the like, as well as an electric vehicle (EV), a hybrid vehicle (HV), and a plug-in hybrid vehicle (PHV).

According to the present disclosure, it is possible to accurately determine whether or not an SOC unevenness occurs in an electrode surface of a secondary battery.

BRIEF DESCRIPTION OF THE DRAWINGS

Features, advantages, and technical and industrial significance of exemplary embodiments of the disclosure will be described below with reference to the accompanying drawings, in which like signs denote like elements, and wherein.

DETAILED DESCRIPTION OF EMBODIMENTS

Figure 1:
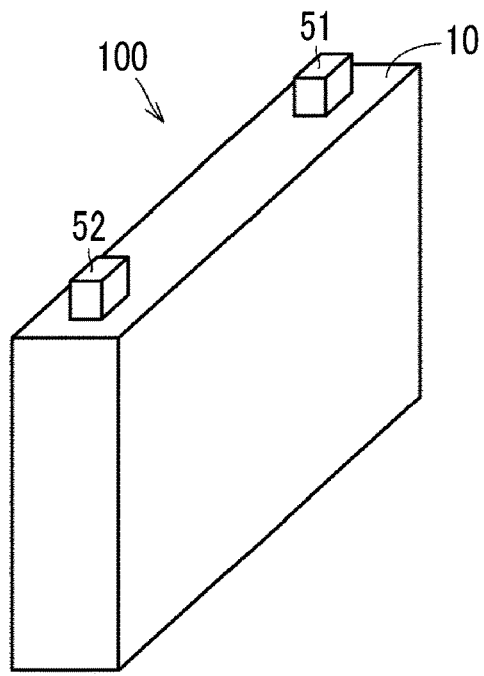
FIG. 1 is a diagram showing a schematic configuration of a secondary battery diagnosed by a diagnostic apparatus for a secondary battery according to an embodiment of the present disclosure.

An embodiment of the present disclosure will be described in detail with reference to the drawings. In the drawings, the same or similar portions are represented by the same reference numerals, and description thereof will not be repeated.

FIG. 1 is a diagram showing a schematic configuration of a secondary battery diagnosed by a diagnostic apparatus for a secondary battery according to this embodiment. Referring to FIG. 1, a secondary battery (hereinafter, simply referred to as a "battery") 100 includes a case 10, a positive electrode terminal 51, and a negative electrode terminal 52. In this embodiment, the battery 100 is a liquid lithium-ion secondary battery that is mountable on an electrified vehicle (for example, EV, HV, or PHV). The case 10 is a rectangular case made of metal (for example, aluminum alloy). The case 10 may be provided with a gas release valve (not shown). An electrode winding body and an electrolyte that constitute the lithium-ion secondary battery are accommodated in the case 10. Hereinafter, the structure of the electrode winding body in the case 10 will be described with reference to FIG. 2.

Figure 2:
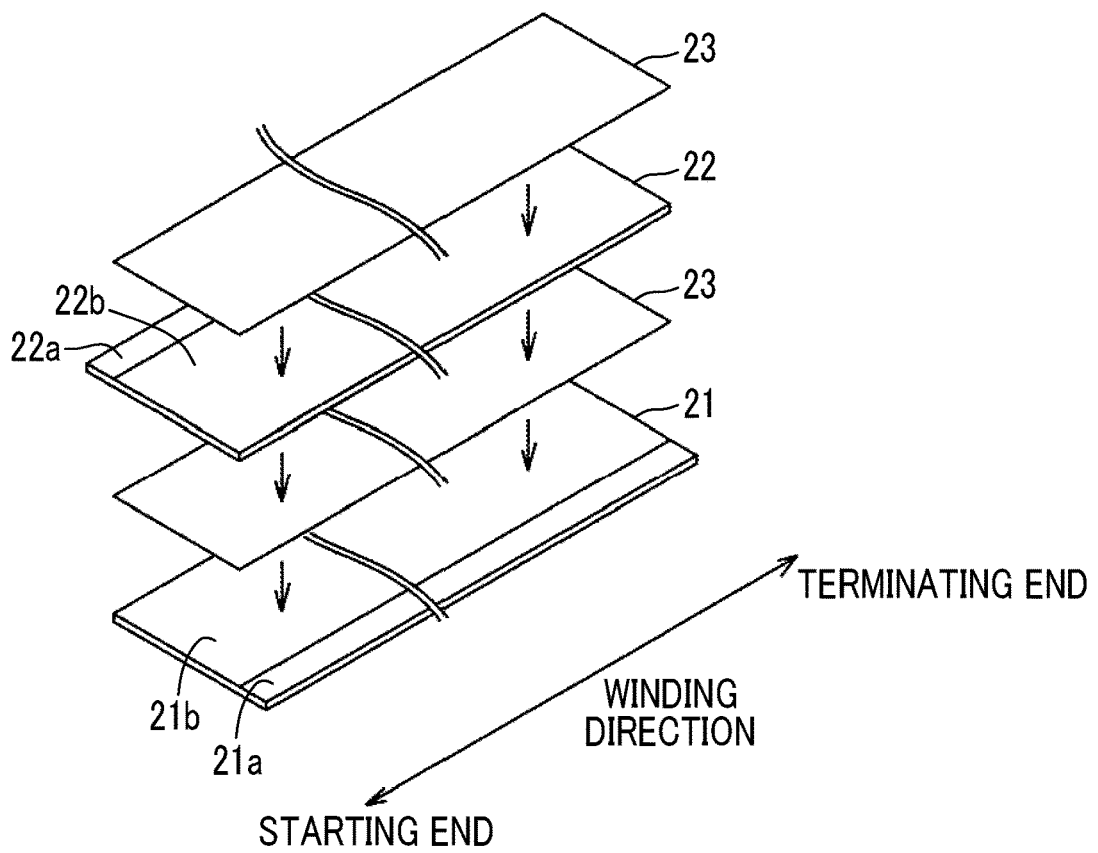
FIG. 2 is a diagram showing a state before winding of an electrode winding body included in the secondary battery shown in FIG. 1.

FIG. 2 is a diagram showing the electrode winding body in a state before winding. Referring to FIG. 2 together with FIG. 1, the electrode winding body is formed in a flat shape by winding a strip-shaped electrode sheet. More specifically, the electrode winding body is formed by alternately laminating a positive electrode sheet 21 and a negative electrode sheet 22 via a separator 23 in order of the positive electrode sheet 21, the separator 23, the negative electrode sheet 22, the separator 23, . . . , and winding the obtained laminate. The number of electrode sheets can be optionally set.

In the electrode winding body, the positive electrode sheet 21 functions as a positive electrode of the battery 100, and the negative electrode sheet 22 functions as a negative electrode of the battery 100. The separator 23 is interposed between the positive electrode sheet 21 and the negative electrode sheet 22. The separator 23 may be fixed at a terminating end in a winding direction shown in FIG. 2.

The positive electrode sheet 21 includes a positive electrode collector 21a and a positive electrode active material layer 21b. The positive electrode active material layer 21b is formed on both surfaces of the positive electrode collector 21a by applying, for example, a positive electrode mixture containing a positive electrode active material onto the surface of the positive electrode collector 21a (for example, aluminum foil). Examples of the positive electrode active material include a lithium transition metal oxide. In this embodiment, a ternary positive electrode material of nickel-cobalt-manganese (NCM) is employed as the positive electrode active material. That is, the positive electrode of the battery 100 according to this embodiment is a ternary positive electrode. The positive electrode active material layer 21b may include at least one of a conductive material (for example, acetylene black) or a binder (for example, polyvinylidene fluoride) in addition to the positive electrode active material.

The negative electrode sheet 22 includes a negative electrode collector 22a and a negative electrode active material layer 22b. The negative electrode active material layer 22b is formed on both surfaces of the negative electrode collector 22a by applying, for example, a negative electrode mixture containing a negative electrode active material onto the surface of the negative electrode collector 22a (for example, copper foil). In this embodiment, a carbon-based material (for example, graphite) is employed as the negative electrode active material. That is, the negative electrode of the battery 100 according to this embodiment is a carbon-based electrode. The negative electrode active material layer 22b may include at least one of a thickener (for example, carboxymethyl cellulose) or a binder (for example, styrene-butadiene rubber) in addition to the negative electrode active material.

The separator 23 is, for example, a microporous film. The presence of pores in the separator 23 facilitates the retention of the electrolyte in the pores. Examples of the material of the separator 23 include a polyolefin resin, such as polyethylene (PE) or polypropylene (PP).

The electrode winding body is sealed in the case 10 together with the electrolyte. The positive electrode collector 21a is electrically connected to the positive electrode terminal 51 shown in FIG. 1, and the negative electrode collector 22a is electrically connected to the negative electrode terminal 52 shown in FIG. 1. The electrolyte may include an aprotic solvent and lithium salt (for example, $LiPF_6$) dissolved in the solvent. Examples of the aprotic solvent include ethylene carbonate (EC), ethyl methyl carbonate (EMC), dimethyl carbonate (DMC), or diethyl carbonate (DEC). Two or more solvents may be mixed and used.

Discharging and charging of the lithium-ion secondary battery are performed through chemical reaction (hereinafter, referred to as "battery reaction") in the interface between each of the negative electrode active material and the positive electrode active material and the electrolyte. At the time of discharging, while battery reaction for emitting lithium ions ($Li^+$) and electrons ($e^-$) is performed on the interface of the negative electrode active material, battery reaction for absorbing lithium ions ($Li^+$) and electrons ($e^-$) is performed on the interface of the positive electrode active material. At the time of charging, battery reaction in which the emission and absorption are reversed is performed. Transfer of lithium ions is performed between the positive electrode sheet 21 and the negative electrode sheet 22 via the separator 23, whereby charging and discharging of the battery 100 are performed.

A closed circuit voltage (CCV), an open circuit voltage (OCV), a battery resistance (R), and a battery current (I) of the battery 100 have a relationship represented by the expression of "CCV=OCV−R×I". The battery resistance (R) includes a purely electric resistance component against movement of electrons between the positive electrode and the negative electrode, and a resistance component that equivalently acts as an electric resistance when a reaction current is generated in the active material interface.

The battery resistance (R) can be represented as a function of a local SOC (hereinafter, referred to as "θ1") in the surface of the positive electrode active material, a local SOC (hereinafter, referred to as "θ2") in the surface of the negative electrode active material, and a temperature of the battery 100. θ1 and θ2 are parameters indicating an SOC for each part in electrode surfaces of the positive electrode and the negative electrode of the battery 100, respectively. θ1 is obtained for each part in the positive electrode surface and corresponds to a value (=current lithium concentration/upper limit of lithium concentration) obtained by dividing a current lithium concentration at the part by a limit lithium concentration. θ2 is obtained for each part in the negative electrode surface and corresponds to a value (=current lithium concentration/upper limit of lithium concentration) obtained by dividing a current lithium concentration at the part by a limit lithium concentration. In each of θ1 and θ2, a maximum value is 1 and a minimum value is 0. A large variation of θ1 in the positive electrode surface means that an SOC unevenness occurs in the positive electrode surface. A large variation of θ2 in the negative electrode surface means that an SOC unevenness occurs in the negative electrode surface. Details of a method of determining whether or not an SOC unevenness occurs will be described below.

The OCV corresponds to a potential difference (=positive electrode OCP−negative electrode OCP) between a positive electrode OCP and a negative electrode OCP. The OCP is an open circuit potential. The OCP may differ depending on the part in the electrode surface. The OCP may be obtained for each part in the electrode surface. The more the SOC of the battery 100 decreases, the more the OCV of the battery 100 tends to decrease. The positive electrode OCP and θ1 in an initial state have a given relationship, and basically, the higher the θ1, the more the positive electrode OCP tends to decrease. The negative electrode OCP and θ2 in an initial state have a given relationship, and basically, the higher the θ2, the more the negative electrode OCP tends to decrease. The initial state corresponds to a state in which the battery 100 is not deteriorated. For example, a state immediately after manufacturing the battery 100 is the initial state.

In a case where the battery 100 is deteriorated, a full charge capacity of the battery 100 decreases. The full charge capacity corresponds to the amount of electricity stored in the battery 100 at the time of full charge. Hereinafter, the full charge capacity is also referred to as a "battery capacity". The deteriorated battery 100 tends to have a greater degree of decrease in OCV due to the decrease in SOC, as compared to the battery 100 in the initial state. Deterioration factors of the battery 100 can be roughly classified into, for example, the following two by a mechanism.

A first deterioration factor is that a lithium receiving capacity (that is, a capacity of each electrode) of each of the positive electrode and the negative electrode decreases. For example, in a case where the active material is worn by energizing or leaving the battery 100, the lithium receiving capacity of the electrode decreases. The lower each of the positive electrode capacity maintenance ratio and the negative electrode capacity maintenance ratio, the greater the degree of deterioration of the battery 100. The positive electrode capacity maintenance ratio is a ratio ($=Q_1/Q_{1A}$) of a current positive electrode capacity ($Q_1$) to a positive electrode capacity ($Q_{1A}$) in the initial state, and may be described as "k1" below. The negative electrode capacity maintenance ratio is a ratio ($=Q_2/Q_{2A}$) of a current negative electrode capacity ($Q_2$) to a negative electrode capacity ($Q_{2A}$) in the initial state, and may be described as "k2" below.

The greater the positive electrode capacity decrease amount and the negative electrode capacity decrease amount, the more the positive electrode capacity maintenance ratio and the negative electrode capacity maintenance ratio decrease, respectively. The positive electrode capacity decrease amount is a difference ($=Q_{1A}-Q_1$) between the positive electrode capacity ($Q_{1A}$) in the initial state and the current positive electrode capacity ($Q_1$), and may be described as "ΔQ1" below. The negative electrode capacity decrease amount is a difference ($=Q_{2A}-Q_2$) between the negative electrode capacity ($Q_{2A}$) in the initial state and the current negative electrode capacity ($Q_2$), and may be described as "ΔQ2" below.

A second deterioration factor is that a relationship between the negative electrode OCP and θ2 changes. For example, in the negative electrode, in a case where the lithium ions used in battery reaction change to by-products (for example, metallic lithium) and the lithium ions hardly contribute to battery reaction, the relationship between negative electrode OCP and θ2 changes. In a case where the lithium-ion secondary battery is maintained at a high temperature, precipitation of lithium is suppressed. When the characteristics of the lithium-ion secondary battery are confirmed by experiments, solely the deterioration due to the first deterioration factor can occur in the lithium-ion secondary battery by maintaining the lithium-ion secondary battery at a high temperature (for example, 50° C.).

Figure 3:
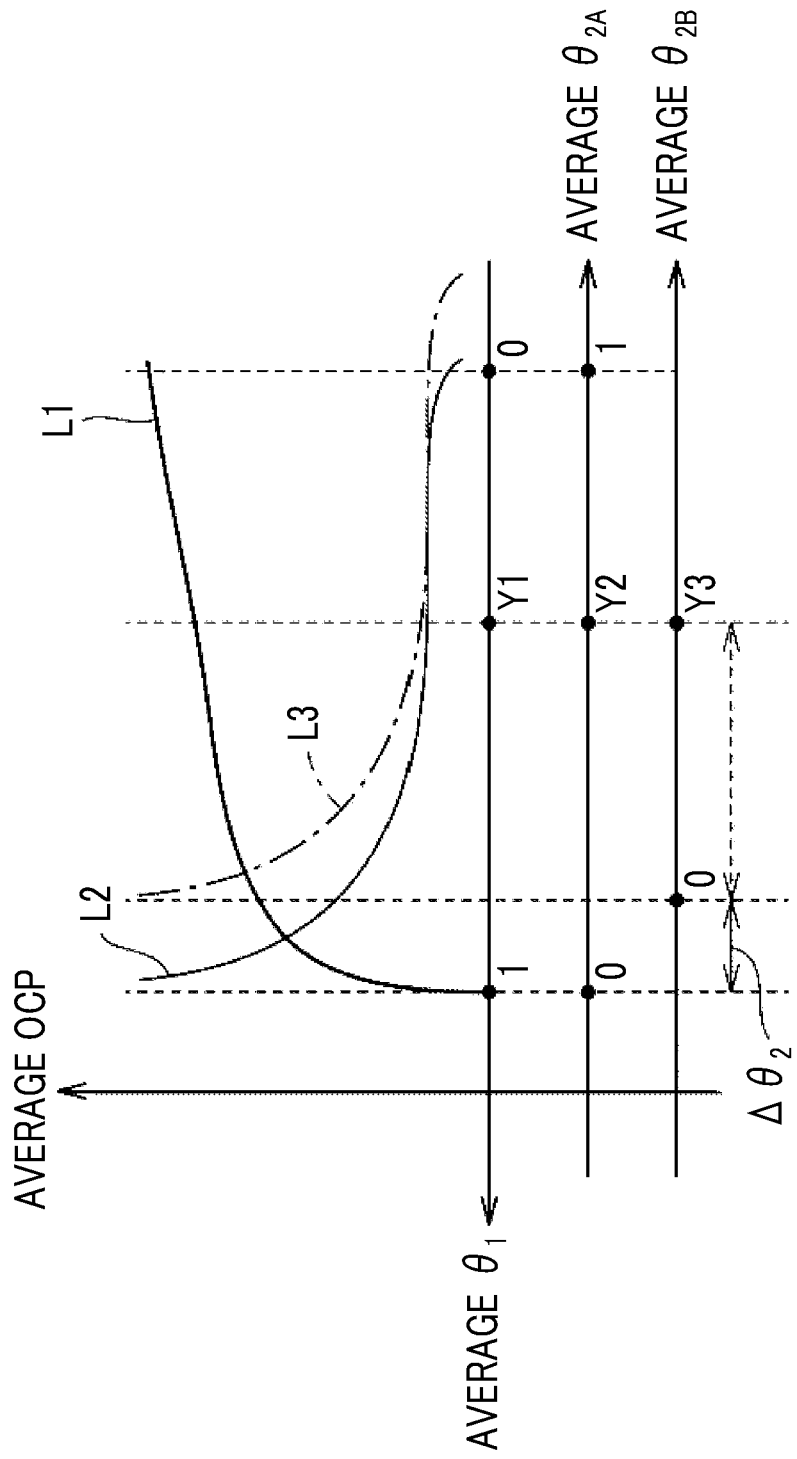
FIG. 3 is a graph for illustrating a deterioration factor of a lithium-ion secondary battery.

FIG. 3 is a graph for illustrating the second deterioration factor. In FIG. 3, an "average OCP" is an average value of the OCP of the entire electrode surface. An "average $\theta_1$" is an average value of $\theta1$ of the entire positive electrode surface of the battery 100. An "average $\theta_{2A}$" is an average value of $\theta2$ of the entire negative electrode surface of the battery 100 in the initial state. An "average $\theta_{2B}$" is an average value of $\theta2$ of the entire negative electrode surface of the deteriorated battery 100. A line L1 corresponds to a characteristic line indicating a relationship between the average OCP and the average $\theta_1$ in the positive electrode of the battery 100. A line L2 corresponds to a characteristic line indicating a relationship between the average OCP and the average $\theta_{2A}$ in the negative electrode of the battery 100 in the initial state. A line L3 corresponds to a characteristic line indicating a relationship between the average OCP and the average $\theta_{2B}$ in the negative electrode of the deteriorated battery 100.

Referring to FIG. 3, the relationship between the positive electrode OCP and $\theta1$ indicated by the line L1 hardly changes from the initial state even though the battery 100 is deteriorated. On the other hand, the relationship between the negative electrode OCP and $\theta2$ indicated by the line L2 in the initial state changes to the relationship indicated by the line L3 in a case where the battery 100 is deteriorated. In the initial state, while the scale "1" of the axis of the average $\theta_1$ coincides with the scale "0" of the axis of the average $\theta_{2A}$, in a case where the battery 100 is deteriorated, the scale "0" of the axis of the average $\theta_{2B}$ deviates by $\Delta\theta_2$ from the scale "1" of the axis of the average $\theta_1$ and approaches the scale "0" of the axis of the average $\theta_1$. The battery capacity decrease amount caused by $\Delta\theta_2$ ($\Delta Q_S$) can be represented by the expression of "$\Delta Q_S = Q_2 \times \Delta\theta_2$".

For example, in a case where the average $\theta_1$ changes from 1 to Y1 in FIG. 3, the amount of lithium represented by "Li emission amount=$(1-Y1) \times Q_1$" is emitted from the positive electrode. Hereinafter, the Li emission amount represented by the above expression will be described as "$\Delta Y$". In the battery 100 in the initial state, since all lithium emitted from the positive electrode is taken into the negative electrode, the average $\theta_{2A}$ becomes Y2 represented as "$Y2=\Delta Y/Q_{2A}$". On the other hand, in the deteriorated battery 100, the average $\theta_{2B}$ becomes Y3 represented as "$Y3=\Delta Y/Q_2-\Delta\theta_2$" due to the deviation (that is, $\Delta\theta_2$) of the axis of the average $\theta_{2B}$. Y3 has a lower value than Y2. This phenomenon may cause decrease in battery capacity even though the capacity of each electrode does not decrease (that is, even though each of k1 and k2 is 1).

$Q_1$ can be represented as "$Q_1=k1 \times Q_{1A}$", $Q_2$ can be represented as "$Q_2=k2 \times Q_{2A}$", and $\Delta\theta_2$ can be represented as "$\Delta\theta_2=\Delta Q_S/Q_2$". Each of $Q_{1A}$ and $Q_{2A}$ can be obtained from, for example, the manufacturing conditions and specifications of the electrode (for example, a theoretical capacity and a charged amount of active material). Therefore, once k1, k2, and $\Delta Q_S$ are known, Y3 corresponding to Y1 can be calculated. In this embodiment, each of k1, k2, and $\Delta Q_S$ corresponds to a parameter (hereinafter, referred to as a "deterioration parameter") indicating the deterioration state of the battery 100. In the initial state, each of k1 and k2 is 1, and $\Delta Q_S$ is 0. When solely the deterioration due to the second deterioration factor occurs in the battery 100, each of k1 and k2 is 1, and $\Delta Q_S$ becomes larger than 0. For example, in a case where lithium is precipitated on the negative electrode, lithium ions emitted from the positive electrode at the time of charging are not taken into the negative electrode, and $\Delta Q_S$ becomes large.

Figure 4:
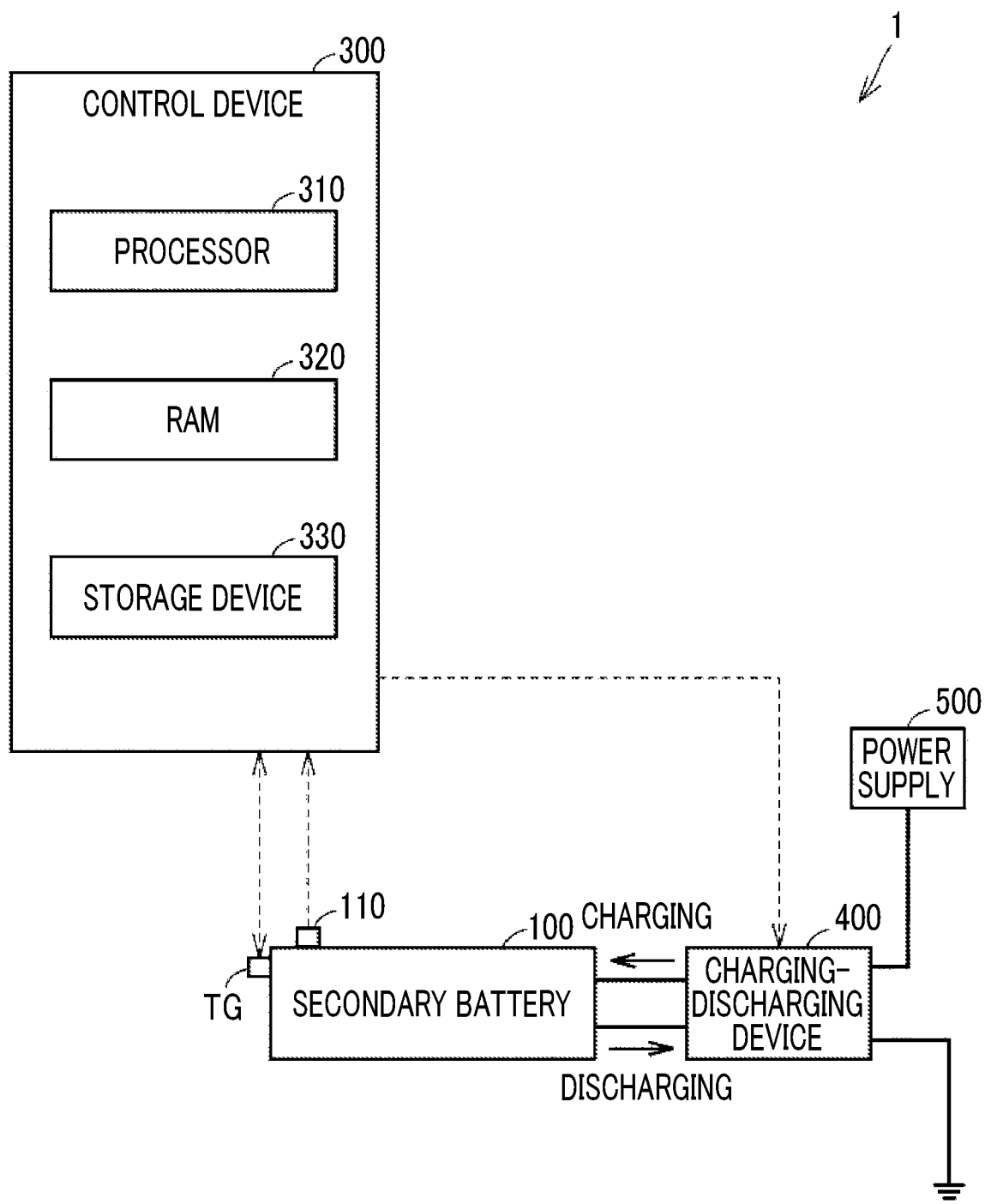
FIG. 4 is a diagram showing a configuration of the diagnostic apparatus for a secondary battery according to the embodiment of the present disclosure.

FIG. 4 is a diagram showing the configuration of the diagnostic apparatus for a secondary battery according to this embodiment. Referring to FIG. 4, a diagnostic apparatus 1 includes a control device 300, a charging-discharging device 400, and a power supply 500, and is configured to diagnose the battery 100 (see FIG. 1 and FIG. 2). A tag TG that stores information on the battery 100 is attached to the battery 100. Information indicating the characteristics (for example, $Q_{1A}$ and $Q_{2A}$) of the battery 100 in the initial state is stored in the tag TG. Information regarding the structure (for example, a material) of the battery 100 may also be stored in the tag TG. As the tag TG, for example, a radio frequency identification (RFID) tag can be employed. The control device 300 is configured to read and rewrite the information stored in the tag TG through wireless communication or wired communication.

The battery 100 is further provided with a monitoring unit 110 that monitors the state of the battery 100. The monitoring unit 110 includes various sensors that detect the state (for example, a temperature, a current, and a voltage) of the battery 100, and outputs a detection result to the control device 300. The control device 300 can acquire the state (for example, a temperature, a current, a voltage, an SOC, and an electric resistance) of the battery 100 based on the output of the monitoring unit 110 (detection values of various sensors).

The battery 100 is electrically connected to the charging-discharging device 400. The charging-discharging device 400 is configured to perform charging and discharging of the battery 100 in accordance with an instruction from the control device 300. The charging-discharging device 400 performs charging of the battery 100 by electric power supplied from the power supply 500. The charging-discharging device 400 may convert electric power discharged from the battery 100 into heat by an electric resistance (not shown), or may store electric power in a predetermined electricity storage device (not shown).

The control device 300 includes a processor 310, a random access memory (RAM) 320, and a storage device 330. As the control device 300, a microcomputer can be employed. As the processor 310, for example, a central processing unit (CPU) can be employed. The RAM 320 functions as a working memory for temporarily storing data to be processed by the processor. The storage device 330 is configured to preserve the stored information. The storage device 330 includes, for example, a read only memory (ROM) and a rewritable nonvolatile memory. In addition to a program, information (for example, a map, a mathematical expression, and various parameters) used in the program is stored in the storage device 330. The number of processors included in the control device 300 is random and may be one or plural.

In this embodiment, the diagnostic apparatus 1 is mounted on an electrified vehicle (not shown) and is configured to diagnose a secondary battery mounted on the electrified vehicle. The power supply 500 is, for example, a main battery that stores electric power for traveling. The battery 100 is, for example, an auxiliary battery. In the diagnostic apparatus 1 mounted on the HV or PHV, the power supply 500 may be a generator (for example, an engine and a motor) controlled by the control device 300, and the battery 100 may be a main battery that stores electric power for traveling. The charging-discharging device 400 may be an electric power conversion circuit (for example, an inverter and a converter) mounted on a vehicle.

Figure 5:
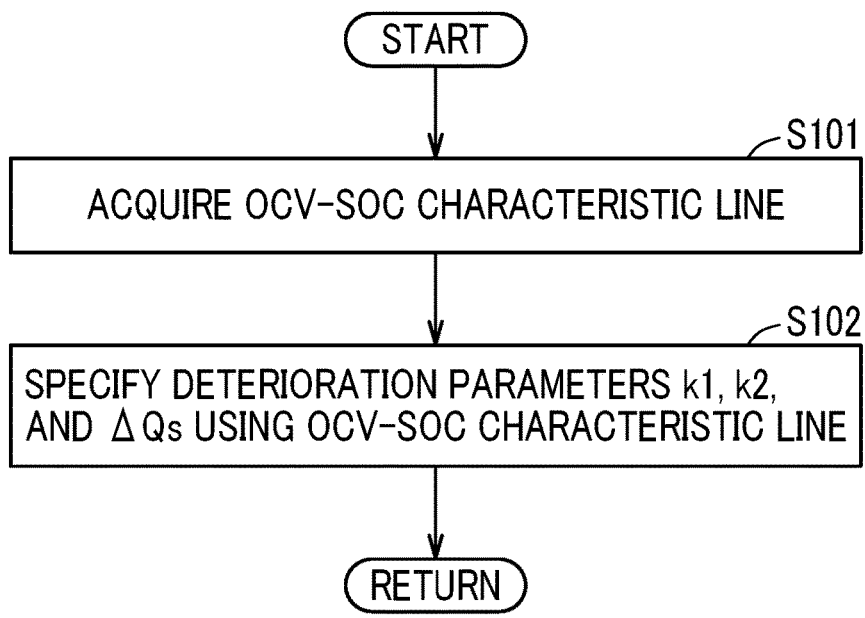
FIG. 5 is a flowchart showing processing relating to deterioration estimation of a secondary battery executed by a control device shown in FIG. 4.

The diagnostic apparatus 1 is configured to estimate the deterioration parameter of the battery 100. FIG. 5 is a flowchart showing processing relating to deterioration estimation of the battery 100 executed by the control device 300. In this embodiment, a series of processing shown in FIG. 5 is executed in S21 of FIG. 10 described below.

Referring to FIG. 5 together with FIG. 4, in step (hereinafter, simply referred to as "S") 101, the control device 300 obtains a characteristic line (hereinafter, referred to as an "OCV-SOC characteristic line") indicating a relationship between the OCV and the SOC of the battery 100 based on the output of the monitoring unit 110 (that is, the detection value of the sensor). More specifically, the control device 300 can obtain the electricity storage amount of the battery 100 (that is, the amount of electricity stored in the battery 100) using a current integrated value. For example, the control device 300 may perform discharging of the battery 100 until the battery 100 is in an empty state, and then perform charging of the battery 100 until the battery 100 is in a full charge state while integrating the current flowing in the battery 100. The control device 300 can obtain the full charge capacity from a current integrated value from the start of charging (empty state) to the end of charging (full charge state). The control device 300 can obtain the SOC (=electricity storage amount/full charge capacity) by dividing the electricity storage amount by the full charge capacity. In addition, the control device 300 can acquire the OCV for each SOC by sequentially measuring the OCV during a period from the start of charging to the end of charging. The control device 300 can measure the OCV when charging is interrupted by intermittently performing charging. The control device 300 can acquire the OCV-SOC characteristic line by plotting the OCV on the vertical axis and the SOC on the horizontal axis, for example.

The SOC can be expressed by a function of the OCV (=positive electrode OCP−negative electrode OCP), k1, k2, and $\Delta Q_S$. The mathematical expression (hereinafter, referred to as an "expression Fs") indicating a relationship among the SOC, the OCV, k1, k2, and $\Delta Q_S$ is stored in advance in the tag TG. In S102, the control device 300 specifies k1, k2, and $\Delta Q_S$ by fitting the expression Fs to the OCV-SOC characteristic line acquired in S101.

Figure 6:
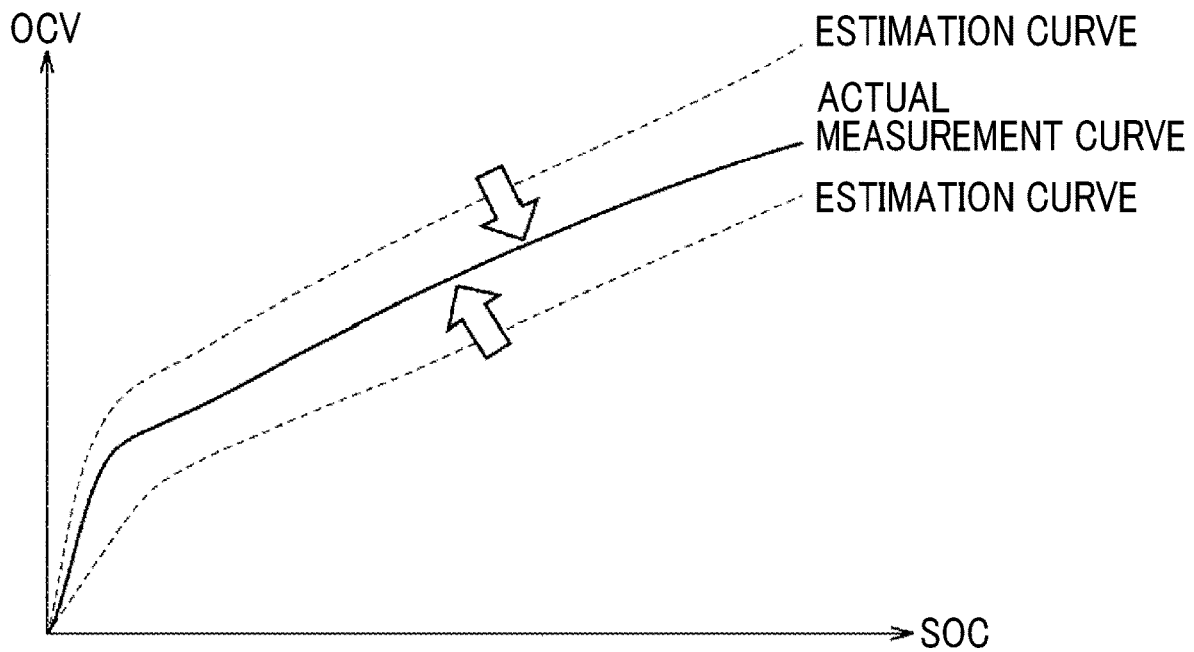
FIG. 6 is a graph for illustrating processing relating to specification of a deterioration parameter shown in FIG. 5.

FIG. 6 is a graph for illustrating the processing of S102 of FIG. 5. Referring to FIG. 6, in S102, the control device 300 searches for k1, k2, and $\Delta Q_S$ such that an OCV-SOC characteristic line (estimation curve) to be obtained from the expression Fs and the OCV-SOC characteristic line (actual measurement curve) acquired in S101 coincide with each other while changing k1, k2, and $\Delta Q_S$. The control device 300 changes k1, k2, and $\Delta Q_S$ such that the estimation curve approaches the actual measurement curve, and specifies k1, k2, and $\Delta Q_S$ where deviation between the estimation curve and the actual measurement curve is minimum. The control device 300 may specify k1, k2, and $\Delta Q_S$ using a least square method.

In this embodiment, the control device 300 performs deterioration estimation of the battery 100 by the processing shown in FIG. 5. k1, k2, and $\Delta Q_S$ obtained by deterioration estimation are preserved in the tag TG. k1, k2, and $\Delta Q_S$ in the tag TG are updated each time the processing of FIG. 5 is executed. The control device 300 may sequentially erase past data to leave solely the latest k1, k2, and $\Delta Q_S$, or may store the latest k1, k2, and $\Delta Q_S$ in addition to the past data.

The control device 300 may preserve k1, k2, and $\Delta Q_S$ in the tag TG in association with the acquisition time.

k1, k2, and $\Delta Q_S$ indicate the deterioration state of the battery 100. The smaller each of k1 and k2, the larger the degree of deterioration of the battery 100. In addition, k1, k2, and $\Delta Q_S$ have a correlation with the amount of lithium precipitated on the negative electrode of the battery 100. The control device 300 may obtain the amount of lithium precipitated on the negative electrode from k1, k2, and $\Delta Q_S$ using information indicating such a correlation (for example, a map stored in the tag TG).

In the processing shown in FIG. 5, the SOC (more specifically, the OCV-SOC characteristic line) of the battery 100 is used to estimate k1, k2, and $\Delta Q_S$ of the battery 100 (and thus the deterioration state of the battery 100). In such a method, when an SOC unevenness occurs in the electrode surface of the battery 100, the deterioration state of the battery 100 is not necessarily estimated with high accuracy.

Therefore, the control device 300 according to this embodiment is configured to accurately determine whether or not an SOC unevenness occurs in the electrode surface of the battery 100 by including an information acquisition unit, a determination unit, a deterioration estimation unit, and an unevenness reduction unit, which will be described below, and to execute the deterioration estimation (FIG. 5) described above solely in a case where determination is made that the SOC unevenness does not occur. With this, it is possible to estimate the deterioration state of the battery 100 with high accuracy.

The information acquisition unit is configured to acquire an electricity storage amount of the battery 100 (that is, the amount of electricity stored in the battery 100) and V/K indicating the magnitude of change in OCV of the battery 100 with respect to temperature change of the battery 100. Although details will be described below, in this embodiment, the information acquisition unit estimates the electricity storage amount of the battery 100 from an average value of the negative electrode OCP (more specifically, the average value of the entire negative electrode surface). In addition, the information acquisition unit obtains V/K by dividing the amount of change in OCV of the battery 100 during a predetermined period by the amount of change in temperature of the battery 100 during the predetermined period.

A method of estimating the electricity storage amount of the battery 100 is not limited to the above. For example, the information acquisition unit may estimate the electricity storage amount of the battery 100 by using at least one of a current integrated value of the battery 100 and a lithium ion concentration in the electrode.

The determination unit is configured to determine whether or not an SOC unevenness occurs in the electrode surface of the battery 100 by using the electricity storage amount of the battery 100 and the V/K acquired by the information acquisition unit.

Figure 7:
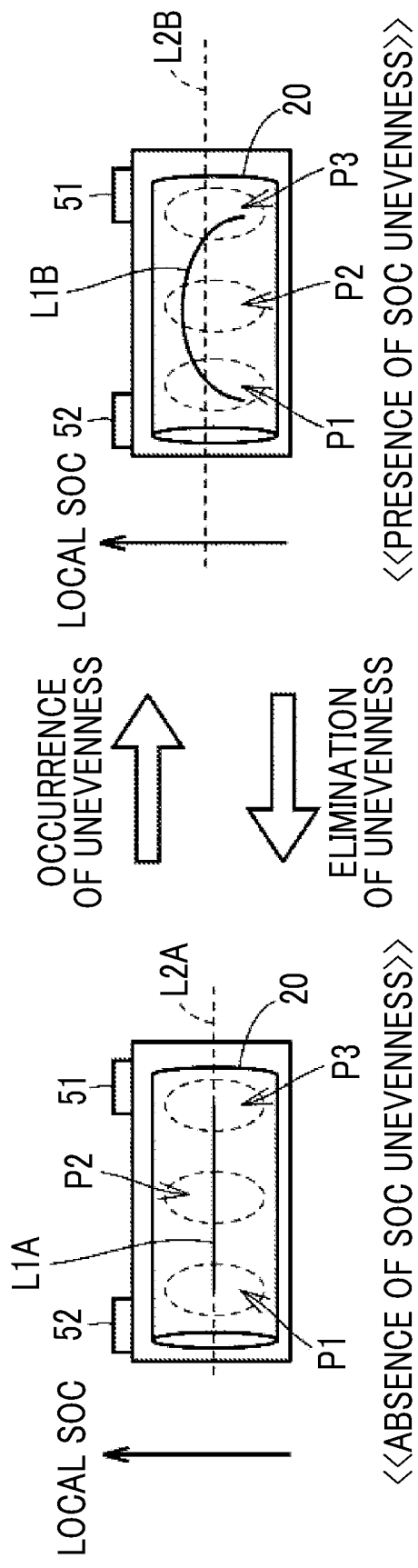
FIG. 7 is a diagram for illustrating an SOC unevenness in an electrode surface of a secondary battery.

FIG. 7 is a diagram for illustrating an SOC unevenness in the electrode surface of the battery 100. In FIG. 7, a part P1 corresponds to an end portion of the electrode winding body 20 on the negative electrode terminal 52 side, a part P2 corresponds to an intermediate portion between the positive electrode terminal 51 and the negative electrode terminal 52 in the electrode winding body 20, and a part P3 corresponds to an end portion of the electrode winding body 20 on the positive electrode terminal 51 side.

Referring to the left side of FIG. 7 (absence of an SOC unevenness), when an SOC unevenness does not occur in the electrode surface of battery 100, distribution of a local SOC (for example, distribution of θ1 or θ2) in the electrode surface is, for example, distribution indicated by a line L1A. An average SOC of each electrode (that is, an average value of the local SOC in the electrode surface of the battery 100) is, for example, a value indicated by a line L2A. In the example of FIG. 7, distribution of the local SOC of each of the parts P1 to P3 substantially coincides with the average SOC (for example, the average $\theta_1$ or the average $\theta_2$).

Referring to the right side of FIG. 7 (presence of an SOC unevenness), when an SOC unevenness occurs in the electrode surface of battery 100, distribution of a local SOC (for example, distribution of θ1 or θ2) in the electrode surface is, for example, distribution indicated by a line L1B. In the example of FIG. 7, in the electrode surface of the battery 100, the local SOC (line L1B) of the parts P1, P3 is lower than the average SOC (line L2B), and the local SOC (line L1B) of the part P2 is higher than the average SOC (line L2B).

Figure 8:
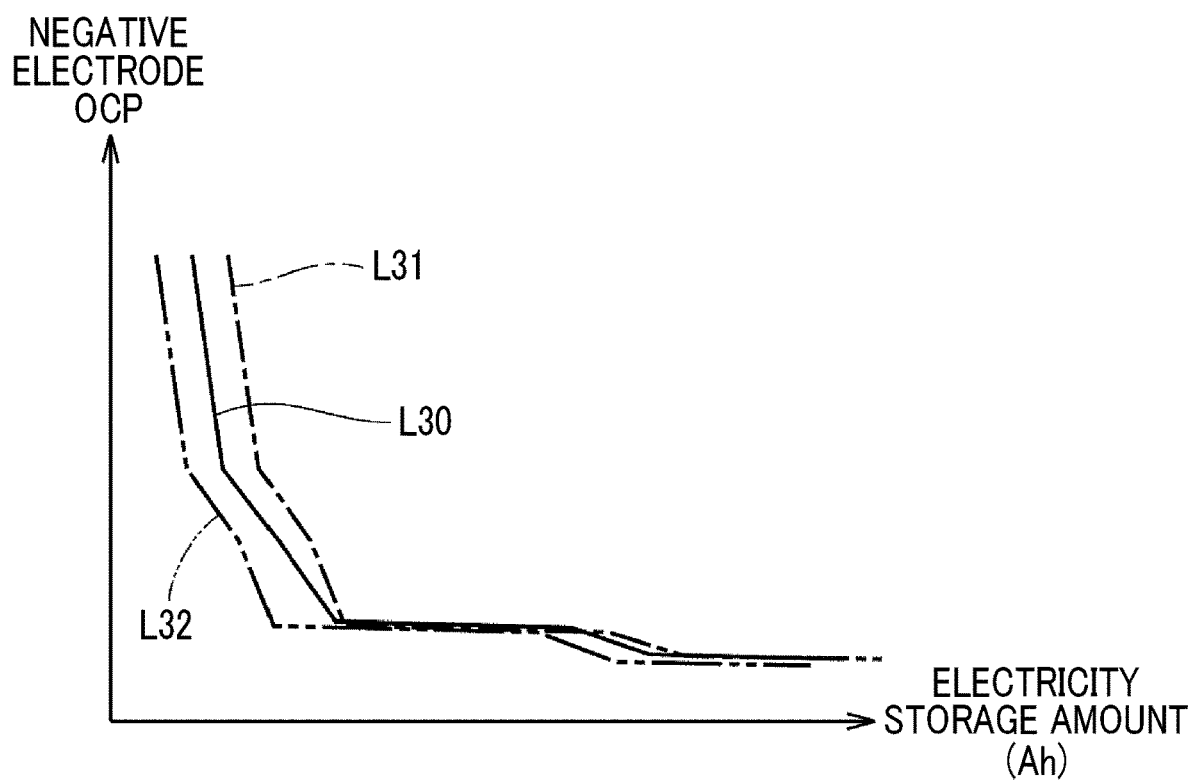
FIG. 8 is a graph showing an example of a relationship between a negative electrode OCP for each part and an electricity storage amount of the secondary battery in a case where an SOC unevenness occurs in the electrode surface of the secondary battery.

FIG. 8 is a graph showing an example of a relationship between the negative electrode OCP for each part and the electricity storage amount of the battery 100 in a case where an SOC unevenness occurs in the electrode surface of the battery 100. In FIG. 8, a line L30 is a characteristic line indicating the transition of the average value of the negative electrode OCP (more specifically, the average value of the entire negative electrode surface). The average value of the negative electrode OCP corresponds to an OCP of the negative electrode terminal 52. Lines L31, L32 are characteristic lines indicating the transition of the negative electrode OCP of the parts P1, P2 shown in FIG. 7, respectively. The characteristic of the part P3 is substantially the same as the characteristic of the part P1 indicated by the line L31.

Referring to FIG. 8, the negative electrode OCP indicated by the line L31 tends to be higher than the average value (line L30) of the negative electrode OCP. The negative electrode OCP indicated by the line L32 tends to be lower than the average value (line L30) of the negative electrode OCP.

Figure 9:
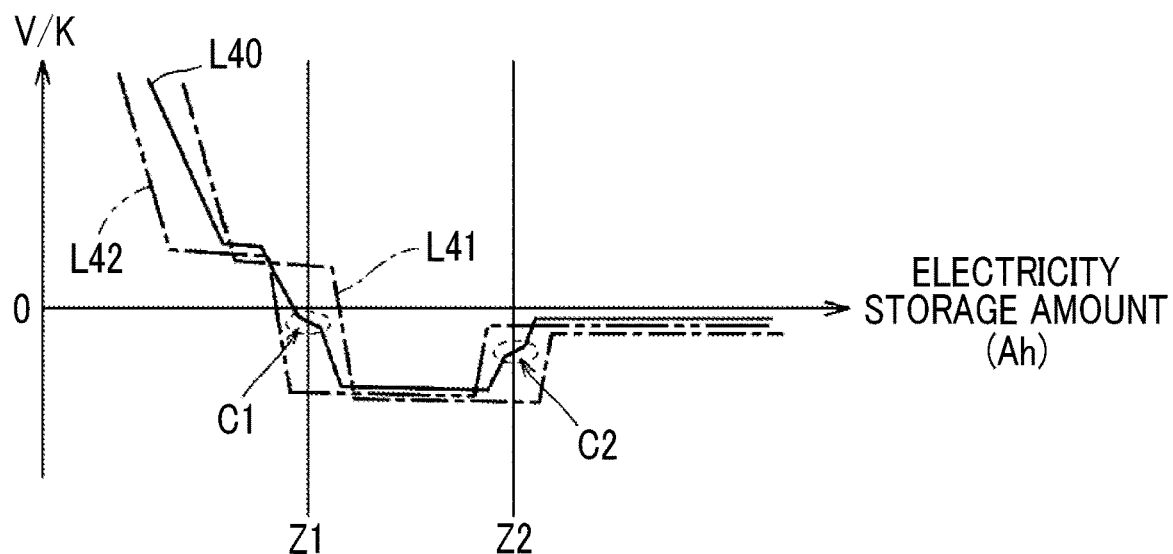
FIG. 9 is a graph showing an example of a relationship between V/K for each part and an electricity storage amount of the secondary battery in a case where an SOC unevenness occurs in the electrode surface of the secondary battery.

FIG. 9 is a graph showing an example of a relationship between V/K for each part and the electricity storage amount of the battery 100 in a case where an SOC unevenness occurs in the electrode surface of the battery 100. In FIG. 9, a line L40 is a characteristic line indicating the transition of an average value of the V/K in the electrode surface of the battery 100. Lines L41, L42 are characteristic lines indicating the transition of the V/K of the parts P1, P2 shown in FIG. 7, respectively. The characteristic of the part P3 is substantially the same as the characteristic of the part P1 indicated by the line L41.

Referring to FIG. 9, the number of inflection points included in a graph indicated by the line L40 (that is, the transition of the average value of the V/K) is greater than that in a graph indicated by each of the line L41 and the line L42. For example, in each of a part C1 in the vicinity of an electricity storage amount Z1 and a part C2 in the vicinity of an electricity storage amount Z2 in the graph indicated by the line L40, an inflection point that does not appear in the graph indicated by each of the line L41 and the line L42 appears.

When an SOC unevenness does not occur in the electrode surface of the battery 100, a relationship between the average value of the V/K and the electricity storage amount of the battery 100 is a graph as indicated by the line L41 or the line L42 shown in FIG. 9. Although the graph indicated by the line L41 and the graph indicated by the line L42 have different positions of inflection points, the basic shapes of the graphs are the same. On the other hand, when an SOC unevenness occurs in the electrode surface of the battery 100, the relationship between the average value of the V/K and the electricity storage amount of the battery 100 is a graph as indicated by the line L40 shown in FIG. 9. In the graph indicated by the line L40, an inflection point that does not appear when an SOC unevenness does not occur appears. The determination unit of the control device 300 according to this embodiment determines that, in a case where the inflection point that does not appear when an SOC unevenness does not occur is confirmed in the graph of the electricity storage amount and the V/K, an SOC unevenness occurs in the electrode surface of the battery 100.

Referring again to FIG. 4, the deterioration estimation unit of the control device 300 is configured to, in a case where the determination unit described above determines that an SOC unevenness does not occur in the electrode surface of the battery 100, estimate the degree of deterioration of the battery 100 using the SOC of the battery 100. In this embodiment, the deterioration estimation unit estimates the degree of deterioration of the battery 100 in S21 of FIG. 10 described below.

The unevenness reduction unit of the control device 300 is configured to, in a case where the determination unit described above determines that an SOC unevenness occurs in the electrode surface of the battery 100, execute predetermined processing (hereinafter, referred to as "unevenness reduction processing") for reducing the SOC unevenness in the electrode surface of the battery 100. In this embodiment, overdischarging of the battery 100 (for example, discharging that continues even though the SOC of the battery 100 reaches 0%) is employed as the unevenness reduction processing. In this embodiment, the unevenness reduction unit executes the unevenness reduction processing in S22 of FIG. 10 described below.

In this embodiment, the above-described information acquisition unit, determination unit, deterioration estimation unit, and unevenness reduction unit are embodied by the processor 310 and a program to be executed by the processor 310. Note that the present disclosure is not limited to this, and each of these units may be embodied by dedicated hardware (electronic circuit).

Figure 10:
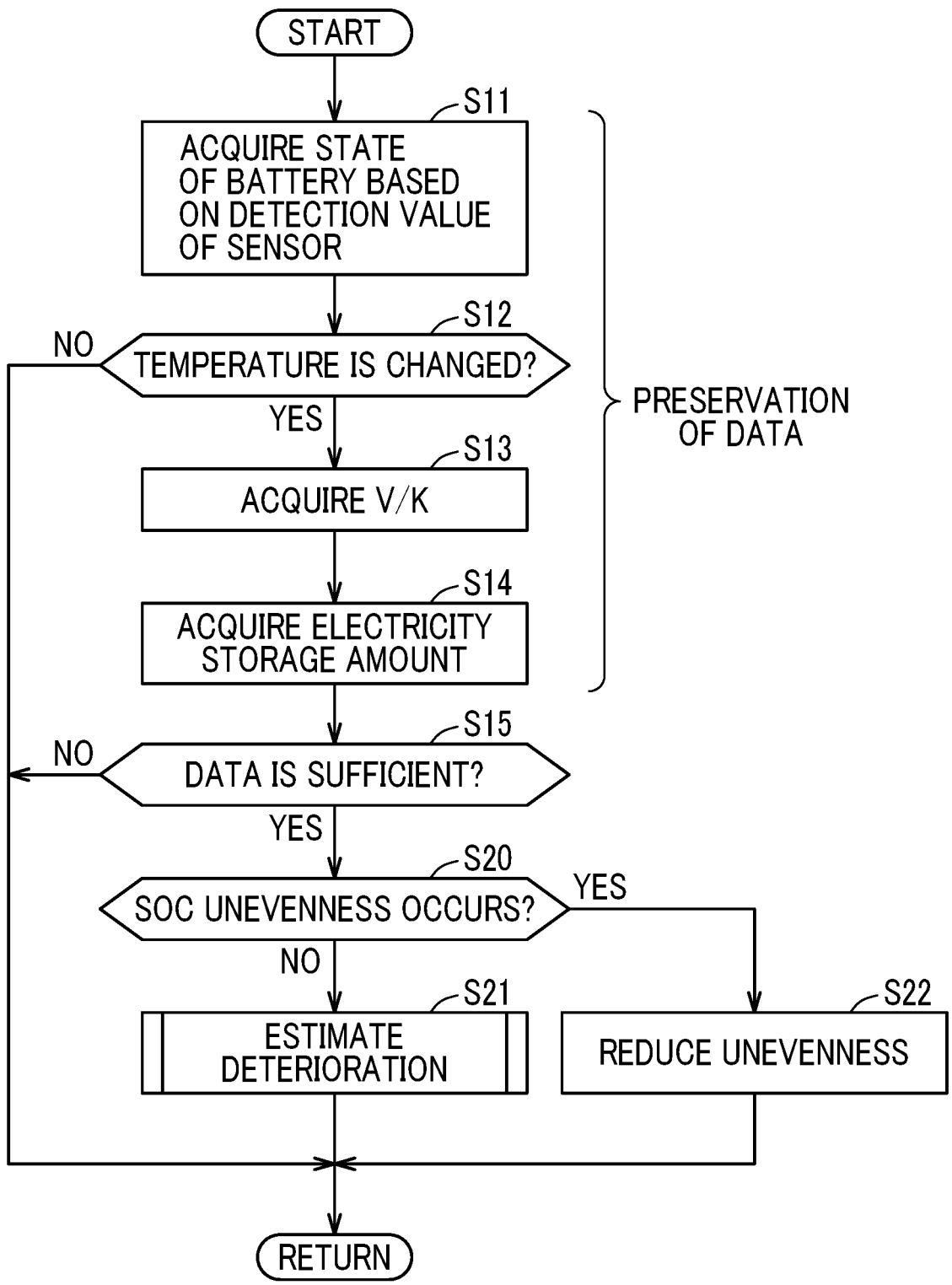
FIG. 10 is a flowchart showing an SOC unevenness detection method according to the embodiment of the present disclosure.

FIG. 10 is a flowchart showing an SOC unevenness detection method according to this embodiment. A series of processing shown in this flowchart is repeatedly executed by being called from a main routine (not shown) at predetermined intervals, for example, while a vehicle on which the diagnostic apparatus 1 is mounted is parked. The predetermined interval can be optionally set. The predetermined interval may be 10 minutes or one hour. The processing shown in FIG. 10 may be repeatedly executed solely at a predetermined time zone (for example, at night when temperature change of the battery 100 is likely to occur).

Referring to FIG. 10 together with FIG. 4, in S11, the control device 300 acquires the state of the battery 100 (in this embodiment, a temperature, a current, and an OCV of the battery 100), and preserves the acquired data in the tag TG in association with the acquisition time. With this, a temperature of the battery 100 (hereinafter, referred to as a "battery temperature"), a current of the battery 100 (hereinafter, referred to as a "battery current"), and an OCV of the battery 100 are preserved in the tag TG. The control device 300 can acquire the battery temperature, the battery current, and the OCV based on the output of the monitoring unit 110 (that is, the detection value of the sensor).

In S12, the control device 300 determines whether or not the battery temperature is changed. The control device 300 determines that the battery temperature is changed, for example, in a case where a difference (absolute value) between a current value of the battery temperature (that is, a battery temperature acquired in a current processing routine) and a previous value of the battery temperature (that is, a battery temperature acquired in a previous processing routine) is equal to or greater than a predetermined value. On the other hand, in a case where the difference (absolute value) between the current value and the previous value of the battery temperature is less than the predetermined value, determination is made that the battery temperature is not changed.

In a case where the battery temperature is not changed (NO in S12), the process is returned to the main routine. On the other hand, in a case where the battery temperature is changed (YES in S12), the control device 300 acquires V/K in S13 and preserves the acquired data (that is, V/K) in the tag TG in association with the acquisition time. In this embodiment, the control device 300 obtains V/K by dividing the amount of change in OCV (hereinafter, referred to as "ΔOCV") of the battery 100 during a period (hereinafter, referred to as a "period T10") from the previous processing routine to the current processing routine by the amount of change in temperature (hereinafter, referred to as "ΔT") of the battery 100 during the period T10. ΔT corresponds to a value obtained by subtracting the previous value from the current value of the battery temperature acquired in S11. ΔOCV corresponds to a value obtained by subtracting a previous value from a current value of the OCV acquired in S11.

After the processing of S13, the control device 300 acquires the electricity storage amount of the battery 100 in S14 and preserves the acquired data (that is, the electricity storage amount) in the tag TG in association with the acquisition time. In this embodiment, the control device 300 obtains the electricity storage amount of the battery 100 from the average value of the negative electrode OCP (that is, the OCP of the negative electrode terminal 52) based on a map stored in the tag TG in advance (see, for example, FIG. 11 described below). The control device 300 can obtain the average value of the negative electrode OCP from the SOC and the OCV of the battery 100 based on, for example, the map stored in the tag TG in advance. The control device 300 can estimate the SOC of the battery 100 from the integrated value of the battery current, for example.

In S15, the control device 300 determines whether or not there is sufficient data (more specifically, a combination of the V/K and the electricity storage amount acquired in S13 and S14) in the tag TG to determine the presence or absence of the inflection point in the graph of the electricity storage amount of the battery 100 and the V/K. In a case where NO is determined in S15 (lack of data), the process is returned to the main routine. In a case where S11 to S14 are repeatedly executed while the vehicle is parked and sufficient data is acquired, YES (sufficient data) is determined in S15. While the vehicle is parked, electric power of the battery 100 is consumed by an in-vehicle device, and the electricity storage amount of the battery 100 tends to decrease.

In a case where YES (sufficient data) is determined in S15, the control device 300 determines in S20 whether or not an SOC unevenness occurs in the electrode surface of the battery 100. In this embodiment, in a case where the inflection point that does not appear when an SOC unevenness does not occur is confirmed in the graph of the electricity storage amount and the V/K, determination is made that the SOC unevenness occurs in the electrode surface of the battery 100.

Figure 11:
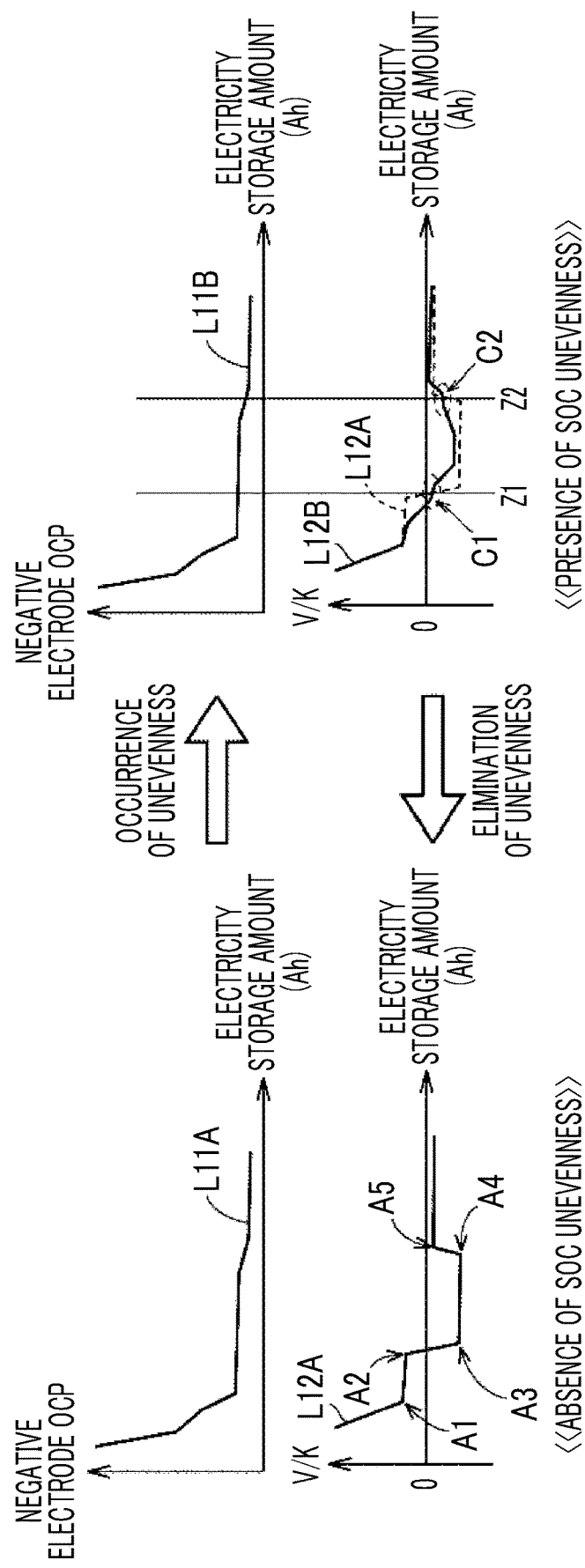
FIG. 11 is a graph for illustrating processing of determining the presence or absence of an SOC unevenness shown in FIG. 10.

FIG. 11 is a graph for illustrating processing (S20 of FIG. 10) of determining the presence or absence of an SOC unevenness.

Referring to the left side of FIG. 11 (absence of an SOC unevenness), when an SOC unevenness does not occur in the electrode surface of the battery 100, a graph of the negative electrode OCP (average value) and the electricity storage amount of the battery 100 is, for example, a graph indicated by a line L11A. When an SOC unevenness does not occur in the electrode surface of the battery 100, a graph (line L12A) of the electricity storage amount of the battery 100 and the V/K includes five inflection points A1 to A5.

Referring to the right side of FIG. 11 (presence of an SOC unevenness), when an SOC unevenness occurs in the electrode surface of the battery 100, the graph of the negative electrode OCP (average value) and the electricity storage amount of the battery 100 is, for example, a graph indicated by a line L11B. The graph indicated by the line L11A and the graph indicated by the line L11B show substantially the same tendency. Note that, when an SOC unevenness occurs in the electrode surface of the battery 100, a graph (line L12B) of the electricity storage amount of the battery 100 and the V/K includes an inflection point in each of a part C1 in the vicinity of an electricity storage amount Z1 and a part C2 in the vicinity of an electricity storage amount Z2, in addition to inflection points corresponding to the inflection points A1 to A5. In this embodiment, in S20 of FIG. 10, the control device 300 determines whether or not an inflection point exists in at least one of the part C1 and the part C2 in the graph of the electricity storage amount of the battery 100 and the V/K, and in a case where the control device 300 determines that an inflection point exists in at least one of the part C1 and the part C2, determination is made that an SOC unevenness occurs in the electrode surface of the battery 100. On the other hand, in a case where the control device 300 determines that an inflection point exists in neither the part C1 nor the part C2, determination is made that an SOC unevenness does not occur in the electrode surface of the battery 100. The control device 300 can determine the presence or absence of the inflection point using a plurality of pieces of most recently measured data (more specifically, a plurality of combinations of the electricity storage amount and the V/K). When a predetermined number (for example, three to five) of pieces of V/K in the vicinity of the electricity storage amount Z1 or the electricity storage amount Z2 is preserved in the tag TG, the control device 300 may determine YES (sufficient data) in S15. The control device 300 may acquire the pieces of data used for determination in S20 over several days.

Referring again to FIG. 10 together with FIG. 4, in a case where NO (absence of an unevenness) is determined in S20, the control device 300 preserves a determination result (that is, absence of an unevenness) in the tag TG in association with the determination time, and estimates the degree of deterioration of the battery 100 in S21. In this embodiment, the control device 300 estimates the degree of deterioration of the battery 100 by executing the series of processing shown in FIG. 5 described above.

On the other hand, in a case where YES (presence of an unevenness) is determined in S20, the control device 300 preserves a determination result (that is, presence of an unevenness) in the tag TG in association with the determination time, and executes the unevenness reduction processing in S22. In this embodiment, the control device 300 reduces an SOC unevenness in the electrode surface of the battery 100 by overdischarging of the battery 100. Further, the control device 300 resets the data used for determination in S20. With this, solely the data acquired after the unevenness reduction processing is used in determination of S20 performed after the unevenness reduction processing.

As described above, the control device 300 can accurately determine whether or not an SOC unevenness occurs in the electrode surface of the battery 100 by executing the processing of S11 to S15 and S20 of FIG. 10. In a case where an SOC unevenness occurs in the electrode surface of the battery 100, the control device 300 can reduce the SOC unevenness in the electrode surface of the battery 100 by executing the unevenness reduction processing.

The determination unit of the control device 300 according to the above-described embodiment determines the presence or absence of an SOC unevenness, based on the presence or absence of an inflection point in the graph of the electricity storage amount of the battery 100 and the V/K. However, the present disclosure is not limited to this, and the determination unit of the control device 300 may determine the presence or absence of an SOC unevenness by using reference information indicating the relationship between the electricity storage amount of the battery 100 and the V/K in a case where an SOC unevenness does not occur in the electrode surface of the battery 100.

Figure 12:
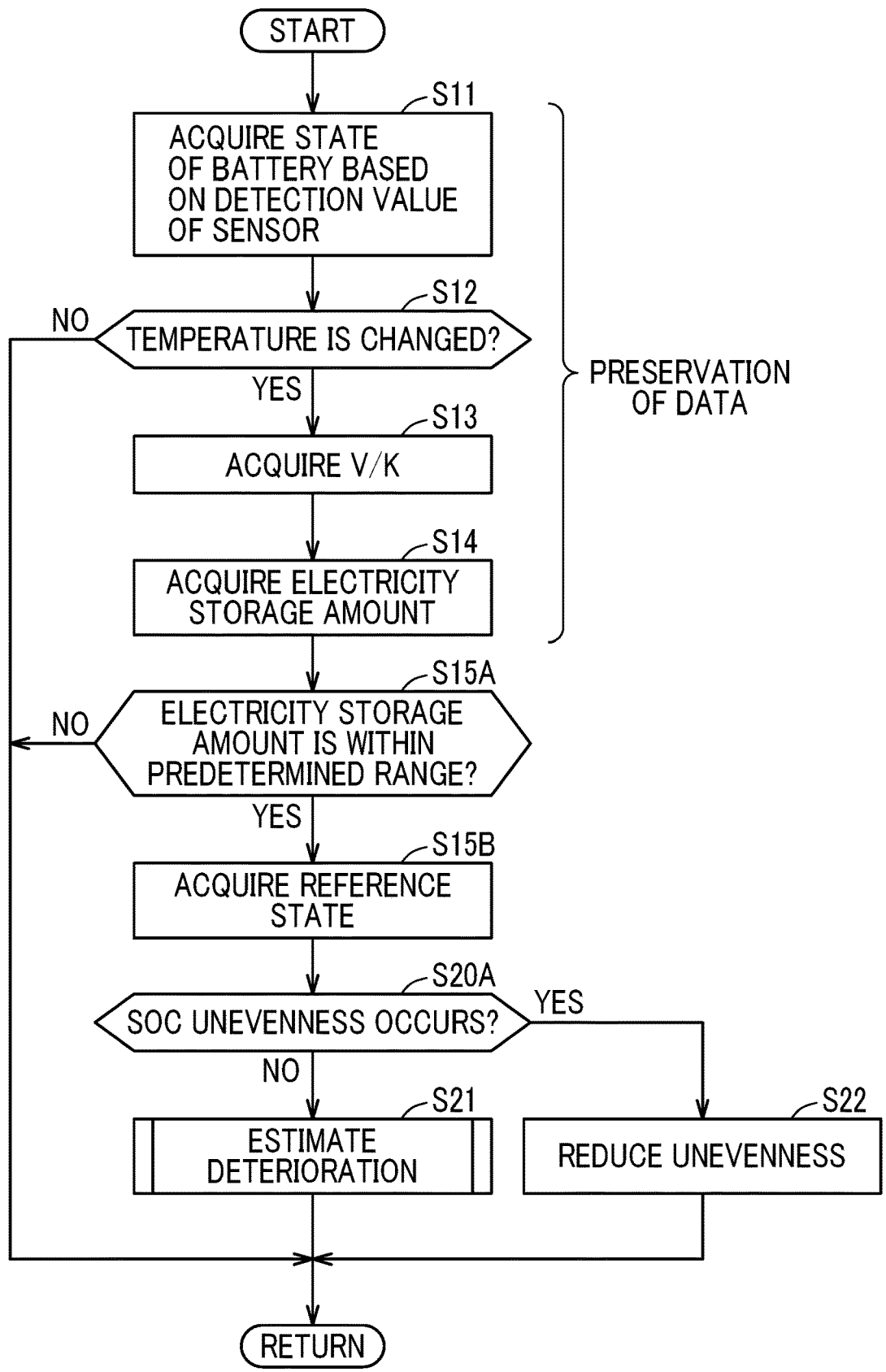
FIG. 12 is a flowchart showing a modification example of the processing shown in FIG. 10.

FIG. 12 is a flowchart showing a modification example of the processing shown in FIG. 10. Processing of FIG. 12 is the same as the processing of FIG. 10 except that S15A, S1, and S20A are employed instead of S15 and S20 (FIG. 10). Hereinafter, S15A, S15B, and S20A will be described.

Referring to FIG. 12 together with FIG. 4, in S15A, the control device 300 determines whether or not the electricity storage amount of the battery 100 acquired in preceding S14 is within a predetermined range. In this modification example, a range (hereinafter, referred to as a "first range") set in the vicinity of an electricity storage amount Z11 and a range (hereinafter, referred to as a "second range") set in the vicinity of an electricity storage amount Z12 shown in FIG. 13 described below are employed as the predetermined range. That is, in a case where the electricity storage amount of the battery 100 is within the first range or the second range, YES is determined in S15A, and in a case where the electricity storage amount of the battery 100 exists within neither the first range nor the second range, NO is determined in S15A. In a case where NO is determined in S15A, the process is returned to the main routine.

In a case where YES is determined in S15A, the process proceeds to S15B. In S15B, the control device 300 acquires the reference information described above. The reference information is information indicating a reference state (more specifically, a relationship between the electricity storage amount of the battery 100 and the V/K in a case where an SOC unevenness does not occur in the electrode surface of the battery 100), and is, for example, a graph indicated by a line L12A in FIG. 13 described below. The reference information may be stored in the tag TG in advance. The information acquisition unit of the control device 300 can acquire the reference information from the tag TG, for example.

After the processing of S15B, the control device 300 determines in S20A whether or not an SOC unevenness occurs in the electrode surface of the battery 100.

Figure 13:
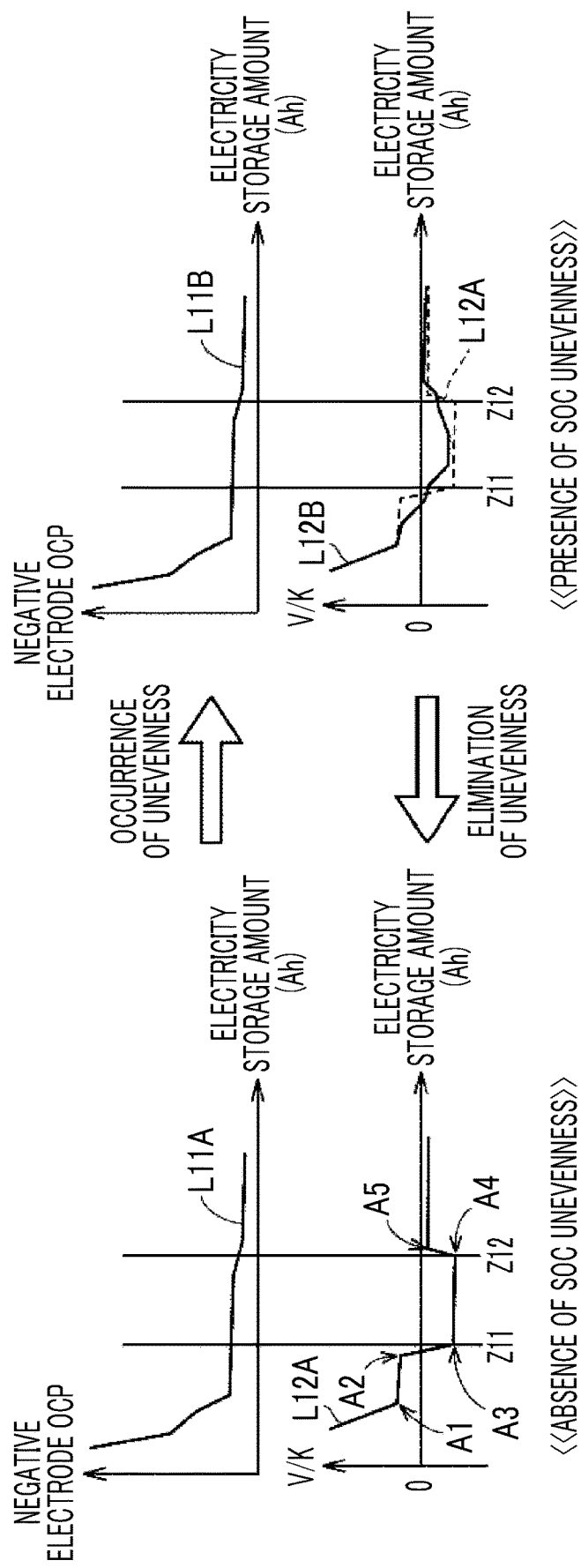
FIG. 13 is a graph for illustrating a modification example of processing of determining the presence or absence of an SOC unevenness shown in FIG. 12.

FIG. 13 is a graph for illustrating a modification example (S20A of FIG. 12) of the processing of determining the presence or absence of an SOC unevenness. The graphs (lines L11A, L12A, L11B, L12B) shown in FIG. 13 are the same as the graphs shown in FIG. 11.

Referring to FIG. 13 together with FIG. 4, inflection points A3, A4 included in the graph (line L12A) of the electricity storage amount and the V/K in a case where an SOC unevenness does not occur in the electrode surface of the battery 100 are located at electricity storage amounts Z11, Z12, respectively. The graph of the electricity storage amount of the battery 100 and the V/K is different between the absence of an SOC unevenness (line L12A) and the presence of an SOC unevenness (line L12B). In particular, in the vicinity of the electricity storage amount Z11 and in the vicinity of the electricity storage amount Z12, deviation between the line L12A and the line L12B is significant. In this modification example, in S20A of FIG. 12, the control device 300 determines whether or not the V/K within the first range or the V/K within the second range acquired in S13 deviates from the V/K within the first range or the V/K within the second range indicated by the reference information (line L12A), and in a case where the control device 300 determines that deviation between the V/K acquired in S13 and the V/K indicated by the reference information occurs, determination is made that an SOC unevenness occurs in the electrode surface of the battery 100. On the other hand, in a case where the control device 300 determines that deviation between the V/K acquired in S13 and the V/K indicated by the reference information does not occur, determination is made that an SOC unevenness does not occur in the electrode surface of the battery 100. In a case where a distance between the V/K acquired in S13 and the V/K indicated by the reference information on a coordinate plane exceeds a predetermined value (more specifically, a boundary value within a range that can be obtained in a case where an SOC unevenness does not occur in the electrode surface of the battery 100), the control device 300 may determine that the V/K acquired in S13 and the V/K indicated by the reference information deviate from each other.

In the above-described embodiment and modification example, a carbon-based electrode is employed as a negative electrode of the lithium-ion secondary battery. However, the present disclosure is not limited to this, and the material of the negative electrode can be appropriately changed. For example, the negative electrode of the lithium-ion secondary battery may be a silicon-based electrode. Instead of a carbon-based material, a silicon-based material (for example, silicon, silicon alloy, or SiO) may be employed. A material of a positive electrode can also be appropriately changed.

The secondary battery to be diagnosed is not limited to the liquid lithium-ion secondary battery, and may be another liquid secondary battery (for example, a nickel-hydrogen secondary battery) or an all-solid secondary battery. The secondary battery to be diagnosed may be a multi-layer flat plate type (stack type) secondary battery instead of a winding type secondary battery.

The diagnostic apparatus 1 shown in FIG. 4 may be a stationary type. The diagnostic apparatus 1 may diagnose a secondary battery recovered from a vehicle. The diagnostic apparatus 1 may be used at home or in a battery recycling factory.

The embodiment disclosed herein is to be considered merely illustrative and not restrictive in all respects. The scope of the present disclosure is defined by the terms of the claims, rather than the above description of the embodiment, and is intended to include any modifications within the scope and meaning equivalent to the terms of the claims.

What is claimed is:

1. A diagnostic apparatus for a secondary battery, the diagnostic apparatus comprising a control device configured to acquire an electricity storage amount that is an amount of electricity stored in the secondary battery, and V/K indicating a magnitude of change in OCV of the secondary battery with respect to temperature change of the secondary battery, and determine whether or not an SOC unevenness occurs in an electrode surface of the secondary battery by using the acquired electricity storage amount and V/K.

2. The diagnostic apparatus according to claim 1, wherein:

the control device is configured to further acquire reference information indicating a relationship between the electricity storage amount and the V/K in a case where the SOC unevenness does not occur in the electrode surface of the secondary battery; and the control device is configured to determine whether or not the SOC unevenness occurs in the electrode surface of the secondary battery by using the acquired electricity storage amount of the secondary battery, V/K, and reference information.

3. The diagnostic apparatus according to claim 1, wherein the control device is configured to, in a case where an inflection point that does not appear when the SOC unevenness does not occur in the electrode surface of the secondary battery exists in a graph of the acquired electricity storage amount of the secondary battery and V/K, determine that the SOC unevenness occurs in the electrode surface of the secondary battery.

4. The diagnostic apparatus according to claim 1, wherein the control device is configured to, in a case where determination is made that the SOC unevenness does not occur in the electrode surface of the secondary battery, estimate a degree of deterioration of the secondary battery by using an SOC of the secondary battery.

5. The diagnostic apparatus according to claim 1, wherein the control device is configured to, in a case where determination is made that the SOC unevenness occurs in the electrode surface of the secondary battery, execute processing of reducing the SOC unevenness.

6. An SOC unevenness detection method comprising:

acquiring an electricity storage amount that is an amount of electricity stored in a secondary battery, and V/K indicating a magnitude of change in OCV of the secondary battery with respect to temperature change of the secondary battery; and determining whether or not an SOC unevenness occurs in an electrode surface of the secondary battery by using the electricity storage amount and the V/K.

7. The SOC unevenness detection method according to claim 6, wherein the secondary battery is a lithium-ion secondary battery.

* * * * *